United States Patent [19]

Price et al.

[11] Patent Number: 4,605,947

[45] Date of Patent: Aug. 12, 1986

[54] TITANIUM NITRIDE MOS DEVICE GATE ELECTRODE AND METHOD OF PRODUCING

[75] Inventors: J. B. Price; Philip J. Tobin, both of Scottsdale; Fabio Pintchovski, Mesa, all of Ariz.; Christian A. Seelbach, San Jose, Calif.

[73] Assignee: Motorola Inc., Schaumburg, Ill.

[21] Appl. No.: 779,533

[22] Filed: Sep. 24, 1985

Related U.S. Application Data

[62] Division of Ser. No. 472,517, Mar. 7, 1983.

[51] Int. Cl.⁴ .................. H01L 29/78; H01L 23/50; H01L 23/52; H01L 29/62
[52] U.S. Cl. ................. 357/23.15; 357/23.1; 357/67; 357/71
[58] Field of Search ............... 357/67, 71, 23.1, 23.15

[56] References Cited

U.S. PATENT DOCUMENTS

| 3,879,746 | 4/1975 | Fournier | 357/71 |
| 4,141,022 | 2/1979 | Sigg et al. | 357/67 |

FOREIGN PATENT DOCUMENTS

| 52-30392A | 3/1977 | Japan | 357/67 |
| 54-22766A | 7/1977 | Japan | 357/71 |
| 55-24454A | 2/1980 | Japan | 357/23.1 |
| 2104290 | 3/1983 | United Kingdom | 357/71 |

Primary Examiner—Martin H. Edlow
Assistant Examiner—E. Fallick
Attorney, Agent, or Firm—John A. Fisher

[57] ABSTRACT

An MOS device having a gate electrode and interconnect of titanium nitride and especially titanium nitride which is formed by low pressure chemical vapor deposition. In a more specific embodiment the titanium nitride gate electrode and interconnect have a silicon layer thereover to improve oxidation protection.

3 Claims, 5 Drawing Figures

TITANIUM NITRIDE MOS DEVICE GATE ELECTRODE AND METHOD OF PRODUCING

This is a division of application Ser. No. 472,517, filed Mar. 7, 1983.

BACKGROUND OF THE INVENTION

In advanced metal oxide semiconductor (MOS) devices it is desirable to provide a gate electrode and interconnect with low electrical resistance. This is essential when the MOS device is a portion of a high density integrated circuit. Generally, a high density integrated circuit is a circuit having interconnect lines which are less than about two micrometers wide, although it will be understood by those skilled in the art that the greater the overall length of the interconnect, which essentially connects in series chains of components in the IC, the greater the need for a low resistance material to form the gate electrodes and interconnects.

At the present time polycrystalline silicon (polysilicon) is used for both gate electrode and interconnect on MOS devices because of its compatibility with high temperature processing which is required subsequent to deposition of the electrode and interconnect. Polysilicon is compatible with subsequent processes and, like single crystal silicon, can be controllably oxidized subsequent to deposition without catastrophic oxidative destruction. Any substitute for the polysilicon gate and interconnect must likewise be compatible with the manufacturing processes, i.e., it must resist oxidation (i.e. be controllably oxidizable), resist the aqueous chemicals and plasmas used in cleaning and etching, and must exhibit the same, or better, conductivity and contact resistance characteristics as polysilicon, especially the contact resistance to doped silicon.

Oxidation resistance is the most difficult of these characteristic to obtain. Molybdenum and tungsten, for example, oxidize to form a volatile oxide which evaporates at high temperatures so that in less than one minute at the high temperature a complete layer of deposited material will disappear. This oxidation can be slowed down by forming a silicide compound. Additionally, many of the known metal disilicides, $MeSi_2$, (i.e., where Me represents molybdenum, tungsten, titanium, etc.) are ten times more conductive than n+ silicon. The refractory metals and silicides, however, are generally characterized by poor contact resistance, especially to monocrystalline silicon, and by processing difficulties.

SUMMARY OF THE INVENTION

The present invention pertains to a titanium nitride ($TiN_x$) gate electrode and interconnect on an MOS device and more specifically to titanium nitride gate electrodes and interconnects formed by low pressure chemical vapor deposition. In one more specific embodiment of the present invention, the titanium nitride gate electrode and interconnect has a thin layer of silicon overlying the layer of titanium nitride to improve the chemical resistance of the titanium nitride to oxidation, aqueous acids, and state-of-the-art plasma etching of silica contact openings.

It is an object of the present invention to provide a new and improved gate electrode and interconnect for an MOS device which is formed of titanium nitride.

It is a further object of the present invention to provide a new and improved gate electrode and interconnect for an MOS device which is simple and inexpensive to form and which is substantially as compatible with IC manufacturing processes as polysilicon while providing a substantial improvement in resistivity.

These and other objects of this invention will become apparent to those skilled in the art upon consideration of the accompanying specification, claims and drawings.

DESCRIPTION OF THE METHOD AND PREFERRED EMBODIMENTS

Figure 1:
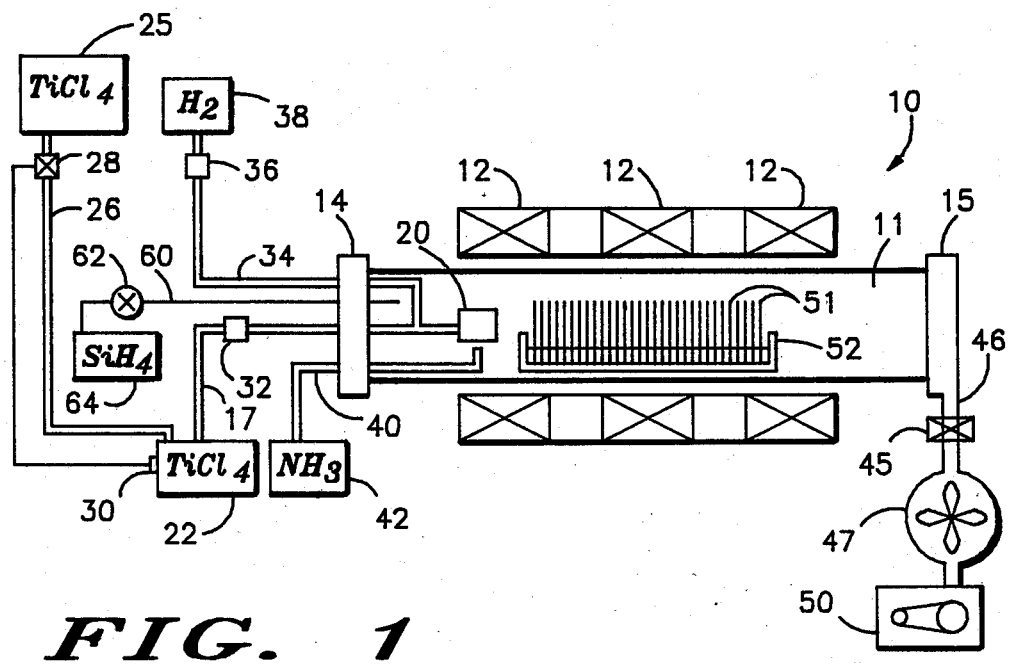
FIG. 1 is a schematic diagram of a low pressure chemical vapor deposition system for depositing layers of titanium nitride.

FIG. 1 schematically illustrates one embodiment of a low pressure chemical vapor deposition system for depositing titanium nitride ($TiN_x$) gate electrode and interconnects for MOS devices. The deposition system includes a resistance wound furnace, generally designated 10, having an elongated cylindrically shaped innerchamber 11 and having electric heating coils 12 wound around the outside thereof. In general, furnace 10 will be the well-known continuously operating furnace which is constructed to provide extremely precise temperatures. The chamber 11 is sealed at opposite ends by end caps 14 and 15. End cap 14 has a plurality of tubes extending therethrough for conducting various gases into the chamber 11. A first tube 17 is connected with a diffuser/mixer 20 within the chamber 11 and extends through the end cap 14 to a source 22 of titanium tetrachloride ($TiCl_4$) vapor. In the present embodiment the source 22 of titanium tetrachloride vapor is a container having a constant amount of titanium tetrachloride liquid therein with an area above the liquid to allow the titanium tetrachloride to vaporize. The vapors are then pumped through the tube 17 at a rate of approximately 11 standard cubic centimeters per minute (SCCM) to the diffuser/mixer 20. If the amount of liquid in the source container varies, the concentration of the titanium tetrachloride vapor changes and can adversely affect the deposition procedure. Therefore, a level maintenance system is connected to the container of the source 22 and consists of a source 25 of titanium tetrachloride liquid which gravity feeds the container of the source 22 through a tube 26. The flow of the liquid through the tube 26 is controlled by a valve 28 which is in turn controlled by a level sensing device 30 affixed to the container of the source 22. A flow control valve 32 is also positioned in the tube 17 to control the flow of titanium tetrachloride vapor from the source 22 to the diffuser/mixer 20. A second tube 34 is connected through a flow control valve 36 to a source of hydrogen gas 38 and extends through the end cap 14 into communication with the diffuser/mixer 20. The hydrogen gas is supplied to the diffuser/mixer 20 at a rate of approximately 50 SCCM. A third tube 40 extends through the end cap 14 from a source of ammonia 42 to a position adjacent the diffuser/mixer 20 within the chamber 11 and ammonia gas is supplied therethrough at a rate of approximately 40 SCCM. These flow rates relate to the particular apparatus being used, and will vary with changes in equipment. The preferred ratio of gas flows (by volume), regardless of equipment configuration, for titanium tetrachloride:ammonia:hydrogen is 11:40:50. The ratio of gas flows, titanium tetrachloride, ammonia and hydrogen, should be controlled to within approximately ±25% or deposits other than titanium nitride result and a loss of deposition rate and uniformity occurs.

A further tube 60 extends through end cap 14, through a control valve 62 to a source of silane ($SiH_4$) 64. The silane is a silicon source for the low pressure, in situ deposition of polysilicon on device wafers either before or after the deposition of a titanium nitride layer, as needed for a particular device embodiment.

The end cap 15 has an outlet port with an exhaust conduit 46 connected thereto and through a vacuum control valve 45 and roots blower 47 to a vacuum pump 50. Thus, the vacuum pump 50 maintains the desired low pressure in the chamber 11 and through proper control of the blower 47 and the flow control valves 32 and 36 the pressure in the chamber 11 and the flow of gas therethrough can be accurately controlled. It has been found that the deposition rate of titanium nitride goes to essentially zero for pressures lower than approximately 100 millitorr (13.3 Pa) and that film thickness uniformity control is lost for pressures greater than 300 millitorr (40 Pa).

Wafers 51 containing the MOS device, or devices, to receive the layer of titanium nitride are loaded into a standard quartz boat 52. Each wafer is positioned vertically in the boat with a horizontal space separating the wafers. Generally, it has been found that approximately a 4–5 mm spacing between wafers is sufficient to allow the proper gas flow; this spacing provides sufficient room for approximately 54 wafers in a single boat. While it has been found that the processing temperature for the titanium nitride layers can vary from approximately 680° C. to approximately 800° C., the preferred temperature is approximately 700° C. At temperatures less than approximately 680° C., $TiNCl_x$ is grown, instead of the desired titanium nitride, and subsequent annealing thereof causes cracks and blisters because of the chlorine. At temperatures greater than approximately 800° C. severe gas phase depletion occurs down the tube and as a result there is a loss of control of film thickness uniformity. With the furance 10 set at a maximum of 700° C., it has been found that the temperature adjacent to the end caps 14 and 15 can be as low as 100° C. to 200° C. with the temperature reaching 680° C. in the hot zone approximately 50 cm inward from the end caps 14 and 15. Approximately another 12–13 cm into the chamber 11, the temperature is at 700° C. and remains flat between the two points (62–63 cm from each end cap 14 and 15). The boat 52 containing the wafers is positioned in the chamber 11 of the furnace 10 so that the wafers are all positioned within the 700° C. flat temperature region. The gas diffuser/mixer 20 and the ammonia outlet end of the tube 40 are located at approximately the 680° C. area between the boat 52 and the end cap 14. Thus, the gases enter the chamber 11 at the 680° C. point and are heated slightly as they flow across the wafers in the quartz boat 52. The hydrogen and titanium tetrachloride are mixed in the chamber 11 insuring that any oxygen that might be present will be reduced by the hydrogen to prevent its mixing with the titanium to grow titanium oxide.

In an actual operation, 54 wafers were placed in the quartz boat 52 with the approximately 4–5 mm spacing. The flat temperature of the furnace 10 within the chamber 11 across the boat 52 was 700° C. Titanium tetrachloride, ammonia, and hydrogen gas were introduced at the 680° C. point illustrated in FIG. 1. The flow of the gases was controlled so that it was approximately 40 SCCM of ammonia, 11 SCCM of titanium tetrachloride and 50 SCCM of hydrogen with the pressure in the chamber 11 remaining within the range of 100 to 300 millitorr (13.3–40 Pa). The growth rate of titanium nitride on the wafers was approximately 3.0 to 3.5 nm per minute. A thin layer between 100 and 200 nm was grown. The resistivity of the titanium nitride layer subsequent to deposit was 75 to 100 microohm centimeter. Subsequent to deposition the titanium nitride layer was annealed in situ at a temperature between 900° C. and 1000° C. for approximately 15 minutes in a nitrogen atmosphere. After annealing the resistivity dropped to 30 to 40 microohm centimeter.

Figure 2:
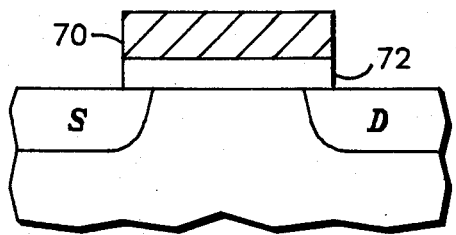
FIGS. 2 and 3 are cross-sectional views of two embodiments of MOS devices having titanium nitride gate electrodes and interconnect.
Figure 3:
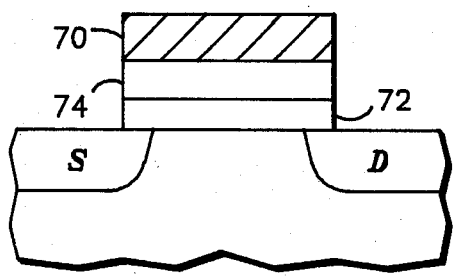

The titanium nitride gate electrode 70 can be deposited directly onto a gate oxide 72, as illustrated in FIG. 2, or a polysilicon layer 74 can be deposited directly on the gate oxide and the titanium nitride 70 deposited on the polysilicon layer, as illustrated in FIG. 3. As is well-known in the art, the gate electrode material can be used as a circuit interconnection. The polysilicon and titanium nitride layers can thus be used to interconnect other gates, other devices, and to directly contact the underlying single crystal silicon.

The titanium nitride has good contact resistance characteristics to both silicon and to aluminum, much better than the contact resistance achieved with the refractory metal disilicides. Further, the titanium nitride layer can be plasma etched with a reactive ion etch system that is anisotropic.

Figure 4:
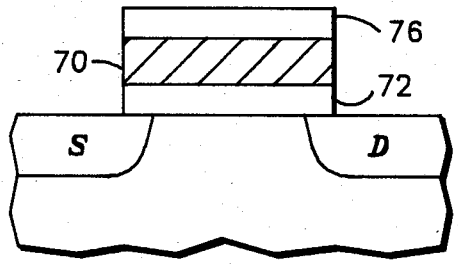
FIGS. 4 and 5 are cross-sectional views of two embodiments of MOS devices having titanium nitride gate electrodes and interconnect with thin layers of silicon thereover.
Figure 5:
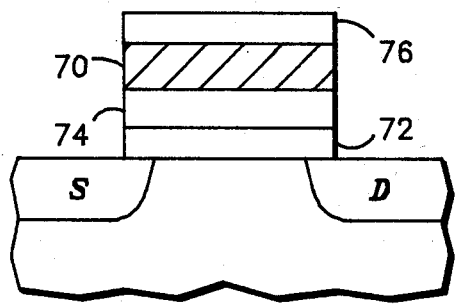

While the titanium nitride layer has relatively good resistance to oxidation, the oxidation resistance can be improved by depositing a few tens of nanometers of pure silicon 76 on top of the titanium nitride 70, as illustrated in FIGS. 4 and 5. This film can easily be selectively removed for making metal contacts, where desired, or, if the silicon is heavily doped, metal contact can be made directly to the silicon. The thin layer of silicon can thus insure good contact between aluminum layers deposited on the wafers subsequent to the gate electrode and interconnect formation.

Thus, a new material, titanium nitride, for use in the formation of gate electrode and interconnects in MOS memories and microprocessors is disclosed. The materials utilized (titanium tetrachloride in a liquid form, ammonia and hydrogen gas) are very inexpensive. Further, the equipment utilized (a resistance heated furnace) is relatively standard equipment in semiconductor processing plants and requires only minor external modifications. As mentioned previously, the titanium tetrachloride vapor is obtained from a liquid source and, since the vapor pressure must be relatively constant to provide optimum control, the liquid source volume must be relatively constant. Further, if the temperature in the reaction zone of the chamber 11 is not properly controlled compounds other than titanium nitride may be formed, which compounds will be detrimental to the wafers being processed. Also, it has been found that the titanium nitride films blister during annealing if the temperature during formation of the films is lower than approximately 680° C. In addition, the blower 47 is utilized in the system to provide load uniformity and reactor cleanliness during the process. The blower 47 provides the high pumping rate and fine tuning thereof in the system which it is believed is required for the proper formation of the titanium nitride, but it will be understood by those skilled in the art that other systems might be devised for providing the required high pumping rate and the blower 47 is simply one embodiment thereof.

While we have shown and described a specific embodiment of this invention, further modifications and improvements will occur to those skilled in the art. We desire it to be understood, therefore, that this invention is not limited to the particular form shown and we intend in the appended claims to cover all modifications which do not depart from the spirit and scope of this invention.

We claim:

1. In a metal oxide semiconductor device, a gate electrode and interconnect overlying an insulator comprising: a layer of titanium nitride overlying the insulator; and a layer of silicon overlying the layer of titanium nitride.

2. The gate electrode and interconnect of claim 1 further comprising a layer of silicon overlying the insulator and underlying the layer of titanium nitride.

3. In a metal oxide semiconductor device, a gate electrode and interconnect overlying an insulator comprising: a layer of silicon overlying the insulator; and a layer of titanium nitride overlying the layer of silicon.

* * * * *